(12) United States Patent
Kim et al.

(10) Patent No.: US 7,015,541 B2
(45) Date of Patent: Mar. 21, 2006

(54) MEMORY CELL INCLUDING STACKED GATE SIDEWALL PATTERNS AND METHOD FOR FABRICATING SAME

(75) Inventors: Jae-Hwang Kim, Seoul (KR); Hee-Seog Jeon, Kyungki-do (KR)

(73) Assignee: Samsung Electronics Co., Ltd., (KR)

(*) Notice: Subject to any disclaimer, the term of this patent is extended or adjusted under 35 U.S.C. 154(b) by 55 days.

(21) Appl. No.: 10/758,523

(22) Filed: Jan. 14, 2004

(65) Prior Publication Data

US 2004/0155280 A1   Aug. 12, 2004

(30) Foreign Application Priority Data

Feb. 12, 2003   (KR) ............. 10-2003-0008791

(51) Int. Cl.
*H01L 29/792* (2006.01)
(52) U.S. Cl. ............. 257/324; 257/314; 257/315; 257/316; 257/320; 257/321
(58) Field of Classification Search ......... 257/239, 257/261, 295, 298, 314–326; 438/201, 211, 438/216, 241, 257, 258, 260–266, 591, 593
See application file for complete search history.

(56) References Cited

U.S. PATENT DOCUMENTS

| | | | |
|---|---|---|---|
| 5,768,192 A | | 6/1998 | Eitan ............... 365/185.24 |
| 5,969,383 A | * | 10/1999 | Chang et al. ............ 257/316 |
| 6,011,725 A | * | 1/2000 | Eitan ............... 365/185.33 |
| 6,218,695 B1 | * | 4/2001 | Nachumovsky ............ 257/296 |
| 6,335,554 B1 | * | 1/2002 | Yoshikawa ............... 257/316 |
| 6,348,711 B1 | * | 2/2002 | Eitan ............... 257/316 |
| 6,673,677 B1 | * | 1/2004 | Hofmann et al. ........... 438/257 |

FOREIGN PATENT DOCUMENTS

| | | |
|---|---|---|
| JP | 2001-230332 | 8/2001 |
| WO | WO 02/11145 | 2/2002 |

* cited by examiner

*Primary Examiner*—Andy Huynh
(74) *Attorney, Agent, or Firm*—F. Chau & Associates LLC

(57) ABSTRACT

A memory cell and a method for fabricating same. The memory cell comprises a source region and a drain region formed in a semiconductor substrate and a channel region defined between the source and drain regions. Charge storage layers are formed the channel region. A gate insulating layer is formed on the channel region between the charge storage layers, and a gate electrode is formed on the gate insulating layer and the charge trapping storage layers.

15 Claims, 5 Drawing Sheets

MEMORY CELL INCLUDING STACKED GATE SIDEWALL PATTERNS AND METHOD FOR FABRICATING SAME

FIELD OF THE INVENTION

The present disclosure relates to a semiconductor device and a method for fabricating same, and more specifically, to a memory cell including an insulating layer for storing electrons having a multi-layer structure and a method of fabricating same.

BACKGROUND OF THE INVENTION

A silicon-oxide-nitride-oxide-silicon (SONOS) memory device has a similar structure to a metal-oxide-semiconductor (MOS) transistor and utilizes an insulating layer having a multi-layer structure as a gate insulating layer. The insulating layer may, for example, include a tunnel insulating layer, a charge trapping layer and a blocking insulating layer. The charge trapping layer is conventionally formed of silicon nitride. The SONOS memory device may write or erase information using Fowler-Nordheim tunneling (F-N tunneling) or hot carrier injection. U.S. Pat. No. 5,768,192 to Eitan entitled "NON-VOLATILE SEMICONDUCTOR MEMORY CELL UTILIZING ASYMMETRICAL CHARGE TRAPPING" relates to writing or erasing information by hot carrier injection.

FIG. 1 is a cross-sectional view showing a conventional SONOS memory cell.

Referring to FIG. 1, a conventional SONOS memory cell includes source and drain regions 12 and 14 formed in a semiconductor substrate 10 and a gate electrode 22 formed on a channel region defined in the semiconductor substrate 10 between the source and drain regions 12 and 14. An insulating layer having a multi-layer structure is disposed between the gate electrode 22 and the semiconductor substrate 10 and includes a tunnel oxide layer 16, a charge trapping layer 18 and a blocking insulating layer 20.

When ground, gate and drain voltages are applied to the source region 12, the gate electrode 22 and the drain region 14, respectively, accelerated or hot charge carriers develop in the channel region near the drain region 14 and electrons or holes are trapped in a charge storage region 24. The polarity of the gate and drain voltage, can define a charge storage region 24 where electrons are trapped.

In the conventional SONOS memory cell, a charge storage region is not defined, but determined depending on the region where hot carrier injection occurs. Therefore, if the region where electrons are injected is different from the region where holes are injected, threshold voltage can vary due to repeating writing or erasing cycles. In addition, the charge trapping layer 18 where the electrons are trapped is positioned between the charge storage regions 24, such that electrons with thermal energy move parallel along the charge trapping layer 18. Therefore, data identification between the two charge storage regions 24 is deteriorated. Further, because an area of the charge trapping layer 18 is determined by a photolithographic process, distribution of a trap site can increase.

SUMMARY OF THE INVENTION

A memory cell, in accordance with an embodiment of the present invention, comprises a source region and a drain region formed in a semiconductor substrate, wherein the source region and the drain region are separated by a predetermined distance, a channel region defined between the source region and the drain region, a first charge storage layer formed on the channel region adjacent the source region, a second charge storage layer formed on the channel region adjacent the drain region, a gate insulating layer formed on the channel region between the first and second charge storage layers, and a gate electrode formed on the gate insulating layer and the first and second charge storage layers.

Each of the first and second charge storage layers may include a tunnel oxide layer, a charge trapping layer and a blocking insulating layer in a stacked formation. The gate insulating layer may have an equivalent oxide thickness less than a thickness of each one of the first and second charge storage layers. The gate insulating layer may comprise sidewalls that are aligned with sidewalls of the first and second charge storage layers.

The gate electrode may comprise a gate pattern formed on the gate insulating layer, and a gate sidewall pattern formed on each of the first and second charge storage layers.

Another memory cell, in accordance with an embodiment of the present invention, comprises a source region and a drain region formed in a semiconductor substrate, wherein the source region and the drain region are separated by a predetermined distance, a channel region defined between the source region and the drain region, at least two charge storage layers formed apart from each other at a first position and a second position on the channel region, wherein the first position is adjacent the source region and the second position is adjacent the drain region, a gate insulating layer formed on the channel region between the at least two charge storage layers, a gate pattern formed on the gate insulating layer, at least one lower sidewall pattern formed on at least one of the at least two charge storage layers, and at least one upper sidewall pattern formed on the at least one lower sidewall pattern, wherein the at least one upper sidewall pattern electrically contacts the at least one lower sidewall pattern and the gate pattern.

Another memory cell, in accordance with an embodiment of the present invention, comprises a source region and a drain region formed in a semiconductor substrate, wherein the source region and the drain region are separated by a predetermined distance, a channel region defined between the source region and the drain region, at least two charge storage layers formed apart from each other at a first position and a second position on the channel region, wherein the first position is adjacent the source region and the second position is adjacent the drain region, a gate insulating layer formed on the channel region between the at least two charge storage layers, a gate pattern formed on the gate insulating layer, at least one lower sidewall pattern formed on at least one of the at least two charge storage layers, and at least one upper sidewall pattern formed on the at least one lower sidewall pattern, wherein the at least one lower sidewall pattern is electrically insulated from the at least one upper sidewall pattern and the gate pattern.

The memory cell may also include at least one inter-gate insulating layer interposed between the at least one lower sidewall pattern and the at least one upper sidewall pattern. A voltage may be independently applied to the gate pattern and to the at least one lower sidewall pattern, A method for fabricating a memory cell, in accordance with an embodiment of the present invention, comprises stacking an insulating layer, a lower conductive layer and a mask layer on a semiconductor substrate, patterning the mask layer, the lower conductive layer and the insulating layer to form a gap region, forming a gate oxide layer on exposed surfaces of the semiconductor substrate and the lower conductive layer in the gap region, forming a gate pattern on the gate oxide layer for filling the gap region, removing the mask layer to expose sidewall portions of the gate pattern, forming an upper sidewall pattern on each exposed sidewall portion of the gate pattern, patterning the lower conductive layer and the insulating layer to form a lower sidewall pattern and a charge storage layer under each upper sidewall pattern, wherein the gate pattern and each upper sidewall pattern is used as an etching mask.

Another method for fabricating a memory cell, in accordance with an embodiment of the present invention, comprises stacking an insulating layer, a lower conductive layer, an interlayer insulating layer and a mask layer on a semiconductor substrate, patterning the mask layer, the interlayer insulating layer, the lower conductive layer and the insulating layer to form a gap region, forming a gate oxide layer on exposed surfaces of the semiconductor substrate and the lower conductive layer in the gap region, forming a gate pattern on the gate oxide layer for filling the gap region, removing the mask layer to expose the interlayer insulating layer and sidewall portions of the gate pattern, forming an upper sidewall pattern on each exposed sidewall portion of the gate pattern and on the interlayer insulating layer, patterning the interlayer insulating layer, the lower conductive layer and the insulating layer to form an inter-gate insulating layer, a lower sidewall pattern and a charge storage layer under each upper sidewall pattern, wherein the gate pattern and each upper sidewall pattern is used as an etching mask, and forming a source region and a drain region in the semiconductor substrate adjacent a first charge storage layer and a second charge storage layer, respectively, wherein the gate pattern and each upper sidewall pattern is used as an ion implantation mask.

Impurities may be doped into an exposed portion of the semiconductor substrate in the gap region to form a channel region. Forming the upper sidewall pattern on each exposed sidewall portion may comprise forming an upper conductive layer on the semiconductor substrate after removing the mask layer, and anisotropically etching the upper conductive layer to expose the lower conductive layer or the interlayer insulating layer.

BRIEF DESCRIPTION OF THE DRAWINGS

Preferred embodiments of the invention may be understood in more detail from the following descriptions taken in conjunction with the accompanying drawings in which.

DETAILED DESCRIPTION OF THE PREFERRED EMBODIMENTS

Figure 1:
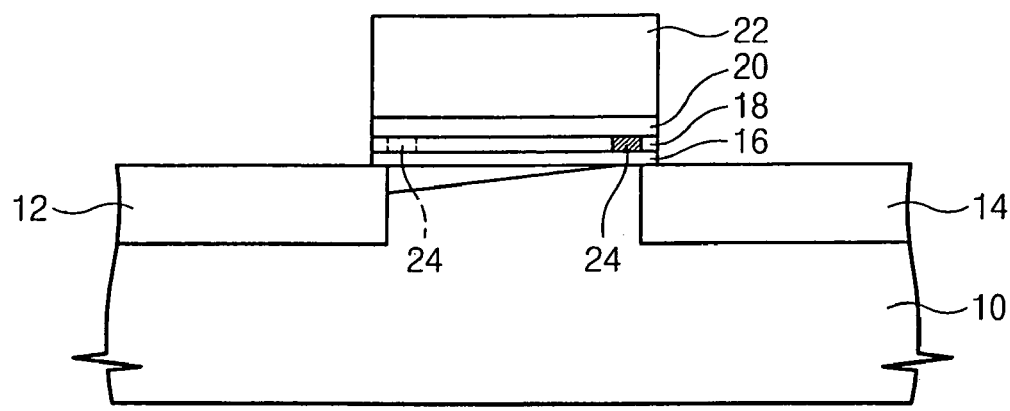
FIG. 1 is a cross-sectional view showing conventional SONOS memory cell.

Preferred embodiments of the present invention will be described below in more detail with reference to the accompanying drawings. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

Figure 2:
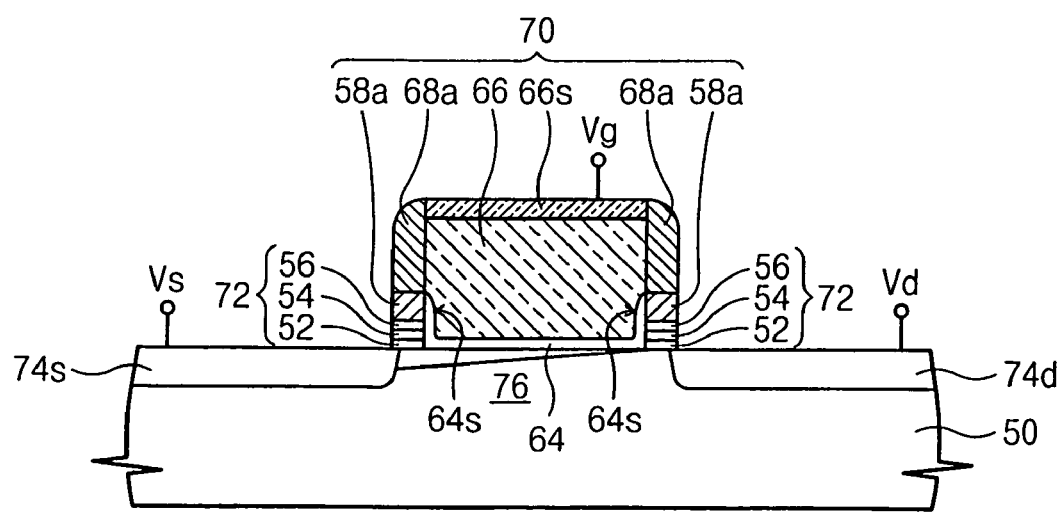
FIG. 2 is a cross-sectional view showing a memory cell in accordance with an embodiment of the present invention.

FIG. 2 is a cross-sectional view showing a memory cell in accordance with an embodiment of the present invention.

Referring to FIG. 2, a SONOS memory cell in accordance with an embodiment of the present invention includes a source region 74s and a drain region 74d formed in a semiconductor substrate 50. Channel region 76 is located between the source region 74s and the drain region 74d. A gate insulating layer 64 and a charge storage insulating layer 72 are formed on the channel region 76, and a gate electrode 70 is formed on the gate insulating layer 64 and the charge storage insulating layer 72.

As shown in FIG. 2, the charge storage insulating layer 72 is formed on the channel region 76 adjacent the source and drain regions 74s and 74d. The gate insulating layer 64 includes sidewalls 64s which are aligned with sidewalls of the charge storage insulating layer 72 and extend in the vertical direction. The gate electrode 70 includes a gate pattern 66 formed on the gate insulating layer 64 and lower and upper sidewall patterns 58a and 68a, respectively. The lower and upper sidewall patterns 58a and 68a are stacked next to the sidewalls of the gate pattern 66 and on the charge storage insulating layer 72. A suicide layer 66s may be formed on top of the gate pattern 66. The gate insulating layer 64 extends to the region between the lower sidewall pattern 58a and the gate pattern 66. The gate pattern 66, the upper sidewall pattern 68a and the lower sidewall pattern 58a include a conductive layer and are electrically connected with one another.

In the memory cell shown in FIG. 2, data is written or erased by applying gate, source and drain voltages Vg, Vs, and Vd to the gate electrode 70, the source region 74s and drain region 74d, respectively. One of the charge storage insulating layers 72 is selected according to the voltage difference between the source and the drain voltages Vs and Vd.

FIGS. 3 through 7 are cross-sectional views for illustrating a method for fabricating a memory cell in accordance with an embodiment of the present invention.

Figure 3:
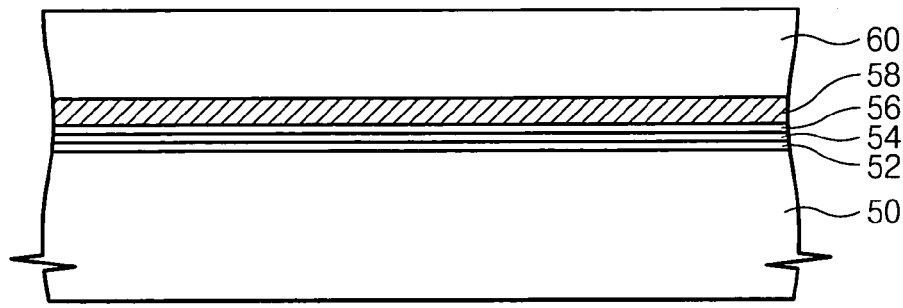
FIGS. 3 through 7 are cross-sectional views for illustrating a method for fabricating a memory cell in accordance with an embodiment of the present invention.

Referring to FIG. 3, a tunnel oxide layer 52, a charge trapping layer 54 and a blocking insulating layer 56 are stacked on a semiconductor substrate 50 to form an insulating layer having a multi-layer structure. A lower conductive layer 58 and a hard mask layer 60 are formed on the multi-layered insulating layer. The multi-layered insulating layer may be formed of, for example, silicon oxide, silicon nitride and silicon oxide that are stacked. The lower conductive layer 58 may be formed of polysilicon. The tunnel oxide layer 52 is one of metal oxide, silicon oxynitride, silicon oxide and a stacked multi-layer structure of the metal oxide, silicon oxynitride and silicon oxide.

Figure 4:
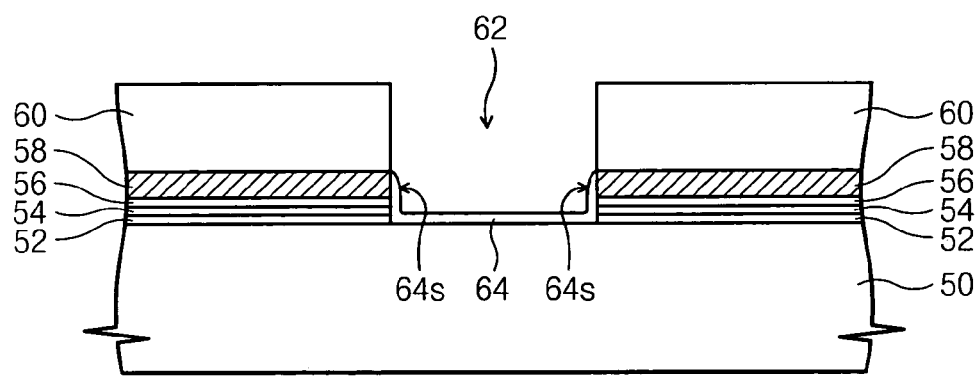

Referring to FIG. 4, the hard mask layer 60, the lower conductive layer 58 and the insulating layer having the multi-layer structure are successively patterned to form a gap region 62. A gate insulating layer 64 is formed on surfaces of the semiconductor substrate 50 and the lower conductive layer 58, which are exposed in the gap region 62. The gate insulating layer 64 may be formed of thermal oxide or chemical vapor deposition (CVD) oxide having a thickness from approximately 80 Å to approximately 150 Å. Before and after forming the gate insulating layer 64, impurities may be doped into the semiconductor substrate 50 for adjusting threshold voltage using the hard mask layer 60 as an ion implantation mask.

Figure 5:
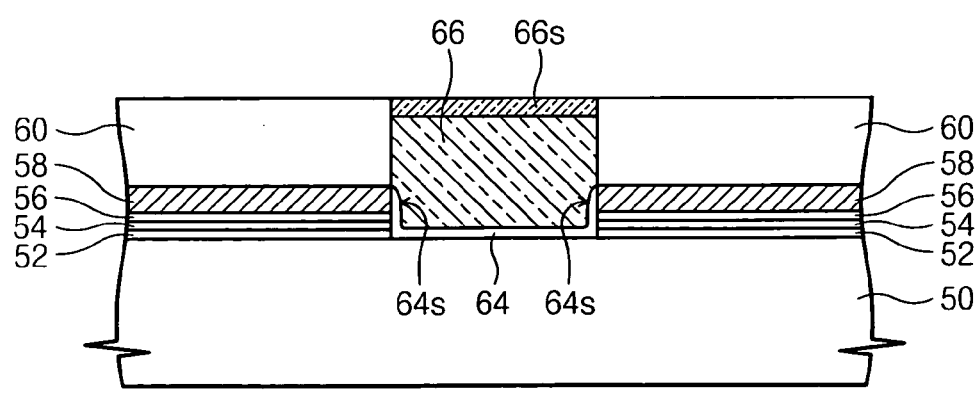

Referring to FIG. 5, a gate conductive layer filling the gap region 62 is formed on the hard mask layer 60 and then polished by a chemical mechanical polishing process to form a gate pattern 66 filling the gap region 62. A silicidation process may be applied to the semiconductor substrate 50 with the gate pattern 66, thereby forming a silicide layer 66s on the gate pattern 66.

Figure 6:
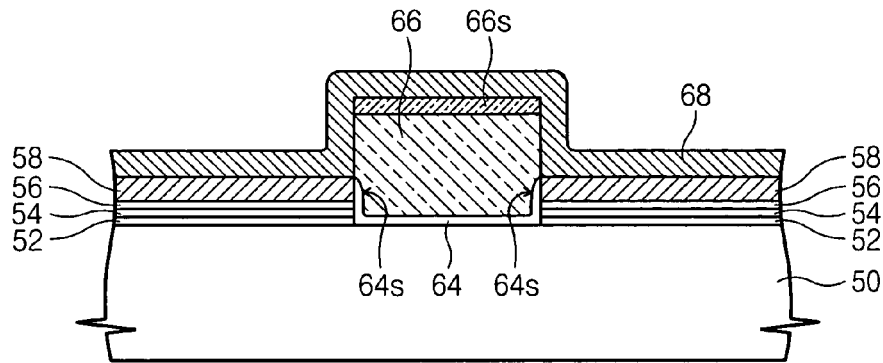

Referring to FIG. 6, a hard mask layer 60 is removed. The hard mask layer 60 may be formed of a silicon nitride layer and removed by wet etching using ammonia or phosphoric acid. An upper conductive layer 68 is formed on an entire surface of a resulting structure of the substrate 50. The thickness of the upper conductive layer 68 may be adjusted according to the cell characteristics. The thickness of the upper conductive layer 68 is a factor in determining the width of the charge storage region of the memory cell.

Figure 7:
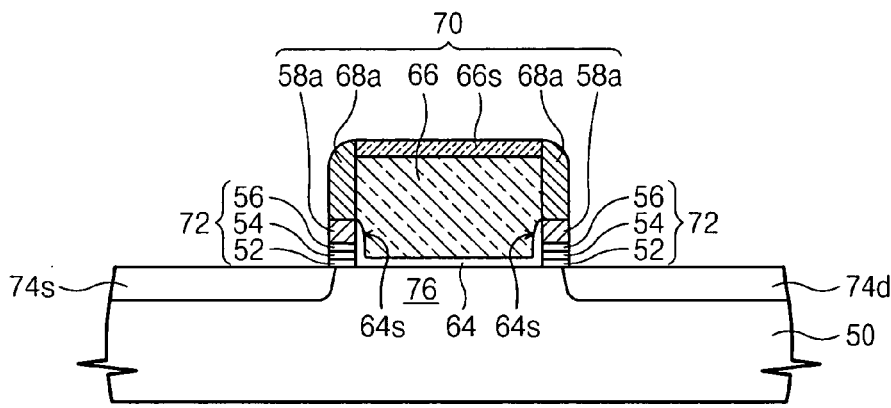

Referring to FIG. 7, the upper conductive layer 68 and the lower conductive layer 58 are anisotropically etched to form a lower sidewall pattern 58a and an upper sidewall pattern 68a, which are stacked adjacent to sidewalls of the gate pattern 66. Using the gate pattern 66 and the upper sidewall pattern 68a as an etch mask, the multi-layered insulating layer is patterned to form the charge storage insulating layer 72 including tunnel oxide layer 52, charge trapping layer 54 and blocking insulating layer 56, which are stacked. Impurities are doped into the semiconductor substrate 50 to form source region 74s and drain region 74d adjacent the charge storage insulating layer 72.

Figure 8:
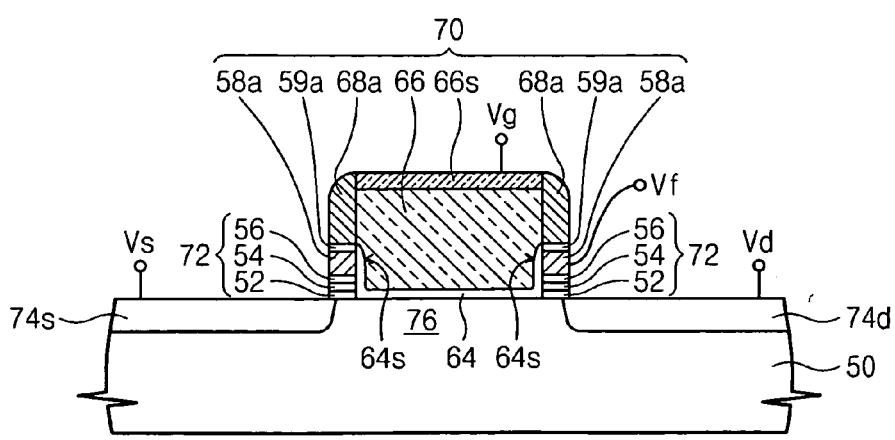
FIG. 8 is a cross-sectional view showing a memory cell in accordance with an embodiment of the present invention.

FIG. 8 is a cross-sectional view showing a memory cell in accordance with an embodiment of the present invention.

Referring to FIG. 8, a SONOS memory cell includes source and drain regions 74s and 74d formed in a semiconductor substrate 50. Channel region 76 is located between the source and drain regions 74s and 74d. A gate insulating layer 64 and a charge storage insulating layer 72 are formed on the channel region 76, and a gate electrode 70 is formed on the gate insulating layer 64 and the charge storage insulating layer 72. The charge storage insulating layer 72 is formed on the channel region 76 adjacent the source and drain regions 74s and 74d. The gate insulating layer 64 includes sidewalls 64s which are aligned with sidewalls of charge storage insulating layer 72 and extend in the vertical direction. The gate electrode 70 includes a gate pattern 66 formed on the gate insulating layer 64 and lower and upper sidewall patterns 58a and 68a, respectively, that are stacked next to the sidewalls of the gate pattern 66. The gate electrode 70 also includes an inter-gate insulating layer 59a interposed between the lower and upper sidewall patterns 58a and 68a. A silicide layer 66s may be formed on top of the gate pattern 66. The gate insulating layer 64 extends to the region between the lower sidewall pattern 58a and the gate pattern 66 and connects to the inter-gate insulating layer 59a. As a result, the lower sidewall pattern 58a is insulated from the gate pattern 66 and the upper sidewall pattern 68a.

In the memory cell shown in FIG. 8, data is written or erased by applying first gate, second gate, source and drain voltages Vg, Vf, Vs, and Vd to the gate pattern 66, the lower sidewall pattern 58a, the source region 74s and drain region 74d, respectively. One of the charge storage insulating layers 72 is selected according to the voltage difference between the source and the drain voltages Vs and Vd. Low voltage for forming an inversion layer in the channel region 76 may be applied to the gate pattern 66 and to the lower sidewall pattern 58a on the non-selected charge storage insulating layer 72, while high voltage for generating hot carriers may be applied to the lower sidewall pattern 58a on the selected charge storage insulating layer 72. Therefore, data retention by the non-selected charge storage insulating layer 72 is improved during writing and erasing operations.

FIGS. 9 through 14 are cross-sectional views for illustrating a method for fabricating a memory cell in accordance with an embodiment of the present invention.

Figure 9:
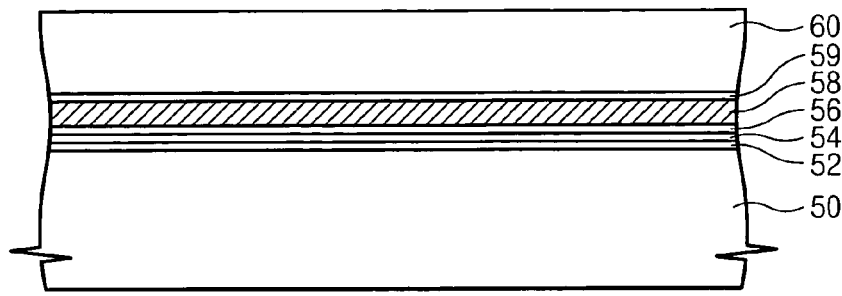
FIGS. 9 through 14 are cross-sectional views for illustrating a method for fabricating a memory cell in accordance with an embodiment of the present invention.

Referring to FIG. 9, a tunnel oxide layer 52, a charge trapping layer 54 and a blocking insulating layer 56 are stacked on a semiconductor substrate 50 to form a multi-layered insulating layer. A lower conductive layer 58, an interlayer insulating layer 59 and a hard mask layer 60 are formed on the insulating layer having the multi-layer structure. The multi-layered insulating layer may be formed of, for example, stacked layers including silicon oxide, silicon nitride and silicon oxide. The lower conductive layer 58 may be formed of polysilicon. The tunnel oxide layer 52 may be formed of one of metal oxide, silicon oxynitride, silicon oxide and a stacked multi-layer structure including metal oxide, silicon oxynitride and silicon oxide.

Figure 10:
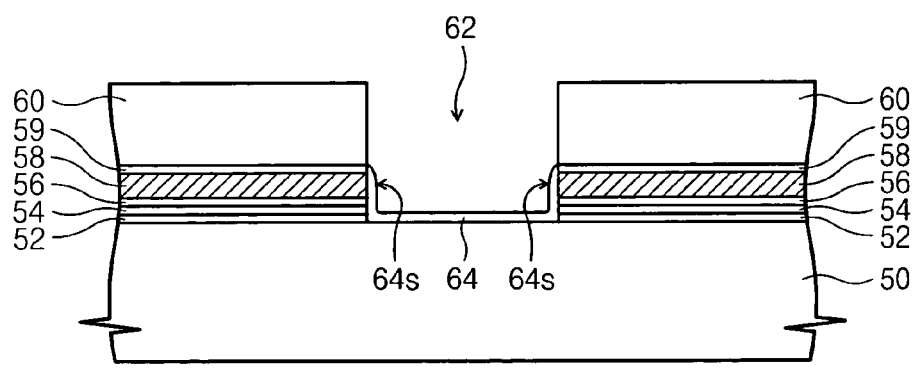

Referring to FIG. 10, the hard mask layer 60, the lower conductive layer 58, the interlayer insulating layer 59 and the insulating layer including the plurality of layers are successively patterned to form a gap region 62. A gate insulating layer 64 is formed on surfaces of the semiconductor substrate 50 and the lower conductive layer 58, which are exposed in the gap region 62. The gate insulating layer 64 may be formed of thermal oxide or CVD oxide having a thickness from approximately 80 Å to approximately 150 Å. The gate insulating layer 64 extends along the sidewall of the gap region 62 and connects to the interlayer insulating layer 59. Before and after forming the gate insulating layer 64, using the hard mask layer 60 as an ion implantation mask, impurities may be doped into the semiconductor substrate 50 for adjusting threshold voltage.

Figure 11:
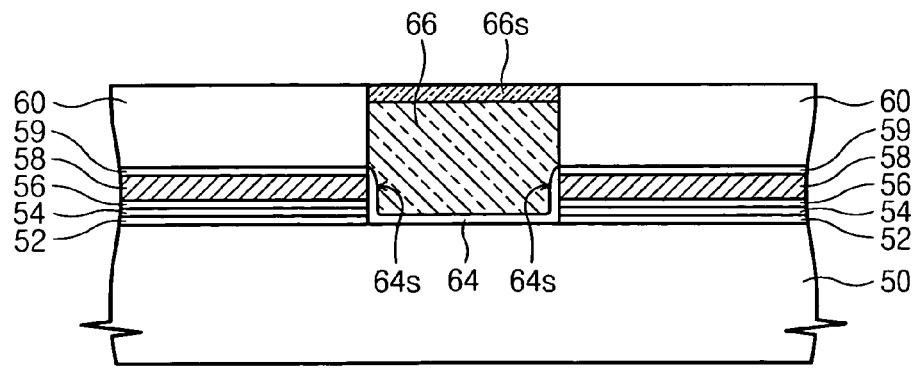

Referring to FIG. 11, a gate conductive layer filling the gap region 62 is formed on the hard mask layer 60 and then polished by a chemical mechanical polishing process to form a gate pattern 66 filling the gap region 62. A silicidation process may be applied to the semiconductor substrate 50 including the gate pattern 66, thereby forming a silicide layer 66s on the gate pattern 66.

Figure 12:
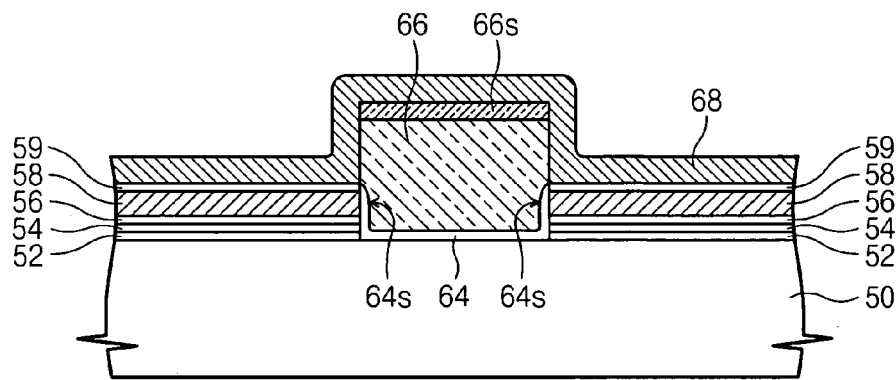

Referring to FIG. 12, a hard mask layer 60 is removed. The hard mask layer 60 may be formed of a silicon nitride layer and removed by wet etching using an ammonia or phosphoric acid solution. An upper conductive layer 68 is formed on an entire surface of a resulting structure of the substrate 50 without the hard mask layer 60. The thickness of the upper conductive layer 68 may be properly adjusted according to cell characteristics. The thickness of the upper conductive layer 68 is a factor in determining width of the charge storage region of the memory cell.

Figure 13:
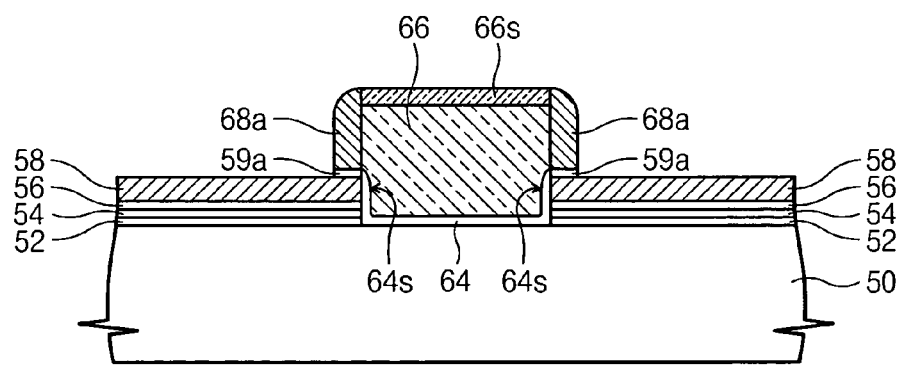

Referring to FIG. 13, the upper conductive layer 68 is anisotropically etched to form an upper sidewall pattern 68a on sidewalls of the gate pattern 66. Using the gate pattern 66 and the upper sidewall pattern 68a as an etch mask, the interlayer insulating layer 59 is patterned to form an inter-gate insulating layer 59a.

Figure 14:
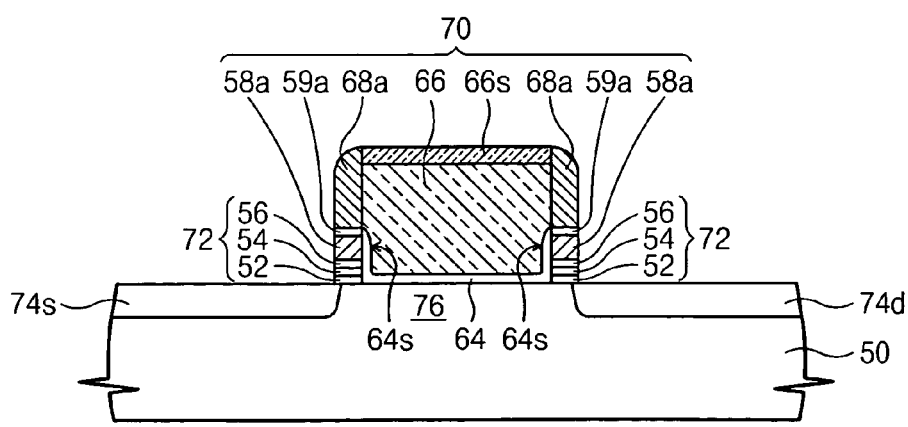

Referring to FIG. 14, the lower conductive layer 58 is anisotropically etched to form lower sidewall patterns 58a under the inter-gate insulating layer 59a. Using the gate pattern 66 and the upper sidewall pattern 68a as an etch mask, the insulating layer having a multi-layer structure is patterned to form a charge storage insulating layer 72 including a tunnel oxide layer 52, charge trapping layer 54 and blocking insulating layer 56, which are stacked. Impurities are doped into the semiconductor substrate 50 to form source region 74s and drain region 74d adjacent the charge storage insulating layer 72.

A conventional SONOS memory cell may include a charge storage insulating layer formed on a channel region, wherein the charge storage insulating layer has an equivalent oxide thickness (EOT) that is larger than a thickness of gate insulating layer. In contrast, according to an embodiment of the present invention, a charge storage insulating layer is formed only on the regions adjacent the source and drain regions, and a thin gate insulating layer is formed on the remaining portion of the channel region. With this configuration, the thin gate insulating layer has an EOT that is less than a thickness of the charge storage insulating layer.

In accordance with an embodiment of the present invention, the charge storage insulating layer is formed only on the region where electrons are trapped, thereby improving an operating rate of the memory cell. In addition, a width of the charge storage insulating layer can be controlled to have a uniform thickness, such that distribution of the cell can be reduced. The charge storage insulating layer may be formed in separate parts on different portions on the channel region (e.g., adjacent the drain and storage regions), thereby improving data identification between the charge storage regions. Furthermore, the width of the charge storage insulating layer along the channel length can be minute, such that electrons and holes can be injected into the same region.

What is claimed is:

1. A memory cell, comprising:
   a source region and a drain region formed in a semiconductor substrate, wherein the source region and the drain region are separated by a predetermined distance;
   a channel region defined between the source region and the drain region;
   a first charge storage layer formed on the channel region adjacent the source region;
   a second charge storage layer formed on the channel region adjacent the drain region;
   a gate insulating layer formed on the channel region between the first and second charge storage layers; and
   a gate electrode formed on the gate insulating layer and the first and second charge storage layers, wherein the gate electrode comprises a gate sidewall pattern formed on each of the first and second charge storage layers, the gate sidewall pattern comprising a lower sidewall pattern and an upper sidewall pattern formed on the lower sidewall pattern.

2. The memory cell as recited in claim 1, wherein the first and second charge storage layers each include a tunnel oxide layer, a charge trapping layer and a blocking insulating layer in a stacked formation.

3. The memory cell as recited in claim 1, wherein the gate insulating layer has an equivalent oxide thickness less than a thickness of each one of the first and second charge storage layers.

4. The memory cell as recited in claim 1, wherein the gate insulating layer comprises sidewalls that are aligned with sidewalls of the first and second charge storage layers.

5. The memory cell as recited in claim 1, wherein the gate electrode further comprises:
   a gate pattern formed on the gate insulating layer.

6. A memory cell, comprising:
   a source region and a drain region formed in a semiconductor substrate, wherein the source region and the drain region are separated by a predetermined distance;
   a channel region defined between the source region and the drain region;
   at least two charge storage layers formed apart from each other at a first position and a second position on the channel region, wherein the first position is adjacent the source region and the second position is adjacent the drain region;
   a gate insulating layer formed on the channel region between the at least two charge storage layers;
   a gate pattern formed on the gate insulating layer;
   at least one lower sidewall pattern formed on at least one of the at least two charge storage layers; and
   at least one upper sidewall pattern formed on the at least one lower sidewall pattern, wherein the at least one upper sidewall pattern electrically contacts the at least one lower sidewall pattern and the gate pattern.

7. The memory cell as recited in claim 6, wherein the at least two charge storage layers each include a tunnel oxide layer, a charge trapping layer and a blocking insulating layer.

8. The memory cell as recited in claim 6, wherein the gate insulating layer has an equivalent oxide thickness less than a thickness of each one of the at least two charge storage layers.

9. The memory cell as recited in claim 6, wherein the gate insulating layer comprises sidewalls that are aligned with sidewalls of the at least two charge storage layers.

10. A memory cell, comprising:
    a source region and a drain region formed in a semiconductor substrate, wherein the source region and the drain region are separated by a predetermined distance;
    a channel region defined between the source region and the drain region;
    at least two charge storage layers formed apart from each other at a first position and a second position on the channel region, wherein the first position is adjacent the source region and the second position is adjacent the drain region;
    a gate insulating layer formed on the channel region between the at least two charge storage layers;
    a gate pattern formed on the gate insulating layer;
    at least one lower sidewall pattern formed on at least one of the at least two charge storage layers; and
    at least one upper sidewall pattern formed on the at least one lower sidewall pattern, wherein the at least one lower sidewall pattern is electrically insulated from the at least one upper sidewall pattern and the gate pattern.

11. The memory cell as recited in claim 10, wherein the at least two charge storage layers each include a tunnel oxide layer, a charge trapping layer and a blocking insulating layer.

12. The memory cell as recited in claim 10, wherein the gate insulating layer has an equivalent oxide thickness less than a thickness of each one of the at least two charge storage layers.

13. The memory cell as recited in claim 10, further comprising at least one inter-gate insulating layer interposed between the at least one lower sidewall pattern and the at least one upper sidewall pattern.

14. The memory cell as recited in claim 10, wherein the gate insulating layer comprises sidewalls aligned with sidewalls of the at least two charge storage layers.

15. The memory cell as recited in claim 10, wherein a voltage is independently applied to the gate pattern and to the at least one lower sidewall pattern.

* * * * *